United States Patent
Kapur et al.

(10) Patent No.: US 8,584,073 B2
(45) Date of Patent: Nov. 12, 2013

(54) TEST DESIGN OPTIMIZER FOR CONFIGURABLE SCAN ARCHITECTURES

(75) Inventors: Rohit Kapur, Cupertino, CA (US); Jyotirmoy Saikia, Pachatia (IN); Rajesh Uppuluri, Bangalore (IN); Pramod Notiyath, Bangalore (IN); Tammy Fernandes, Margao (IN); Santosh Kulkarni, Bangalore (IN); Ashok Anbalan, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 554 days.

(21) Appl. No.: 12/248,710

(22) Filed: Oct. 9, 2008

(65) Prior Publication Data

US 2010/0017760 A1  Jan. 21, 2010

Related U.S. Application Data

(60) Provisional application No. 61/082,453, filed on Jul. 21, 2008.

(51) Int. Cl.
*G06F 11/22* (2006.01)
*G06F 17/50* (2006.01)

(52) U.S. Cl.
USPC .......... 716/136; 716/106; 714/732; 714/733; 714/743

(58) Field of Classification Search
USPC ........... 716/100, 106, 54, 132, 136; 714/732, 714/733, 742
See application file for complete search history.

(56) References Cited

U.S. PATENT DOCUMENTS 5,983,380 A  11/1999  Motika et al.
5,991,909 A *  11/1999  Rajski et al. .................. 714/729
(Continued)

FOREIGN PATENT DOCUMENTS

JP  11166962 A  6/1999
JP  2006023168 A  1/2006

OTHER PUBLICATIONS

Nicola Nicolici and Bashir M. Al-Hashimi, "Scan latch partitioning into multiple scan chains for power minimization in full scan sequential circuits", Design, Proceedings of the conference on Design, automation and test in Europe, Paris, France, pp. 715-722 (2000).

(Continued)

*Primary Examiner* — Jack Chiang
*Assistant Examiner* — Brian Ngo
(74) *Attorney, Agent, or Firm* — Haynes Beffell & Wolfeld LLP; Warren S. Wolfeld

(57) ABSTRACT

Roughly described, a scan-based test architecture is optimized in dependence upon the circuit design under consideration. In one embodiment, a plurality of candidate test designs are developed. For each, a plurality of test vectors are generated in dependence upon the circuit design and the candidate test design, preferably using the same ATPG algorithm that will be used downstream to generate the final test vectors for the production integrated circuit device. A test protocol quality measure such as fault coverage is determined for each of the candidate test designs, and one of the candidate test designs is selected for implementation in an integrated circuit device in dependence upon a comparison of such test protocol quality measures. Preferably, only a sampling of the full set of test vectors that ATPG could generate, is used to determine the number of potential faults that would be found by each particular candidate test design.

41 Claims, 10 Drawing Sheets

(56) References Cited

U.S. PATENT DOCUMENTS

| | | | |
|---|---|---|---|
| 6,055,649 A * | 4/2000 | Deao et al. ............... 714/30 |
| 6,442,723 B1 | 8/2002 | Koprowski et al. |
| 6,516,432 B1 | 2/2003 | Motika et al. |
| 6,543,020 B2 | 4/2003 | Rajski et al. |
| 6,557,129 B1 | 4/2003 | Rajski et al. |
| 6,587,996 B1 | 7/2003 | Reohr, Jr. et al. |
| 6,662,327 B1 | 12/2003 | Rajski |
| 6,675,337 B1 * | 1/2004 | Tung et al. ............... 714/733 |
| 6,684,358 B1 | 1/2004 | Rajski et al. |
| 6,708,303 B1 | 3/2004 | Gallia |
| 6,807,645 B2 | 10/2004 | Angelotti et al. |
| 6,865,706 B1 * | 3/2005 | Rohrbaugh et al. ......... 714/738 |
| 6,904,553 B1 | 6/2005 | Brown |
| 6,961,886 B2 | 11/2005 | Motika et al. |
| 6,990,619 B1 * | 1/2006 | Kapur et al. ............... 714/729 |
| 7,302,624 B2 * | 11/2007 | Rajski et al. ............... 714/732 |
| 7,395,473 B2 * | 7/2008 | Cheng et al. ............... 714/729 |
| 7,418,640 B2 | 8/2008 | Kapur et al. |
| 7,716,548 B2 * | 5/2010 | Cheng et al. ............... 714/729 |
| 7,752,515 B2 * | 7/2010 | Dervisoglu et al. ......... 714/728 |
| 7,840,861 B2 * | 11/2010 | Sul ............... 714/726 |
| 2003/0046623 A1 | 3/2003 | Khoche et al. |
| 2003/0115564 A1 | 6/2003 | Chang et al. ............... 716/8 |
| 2003/0126533 A1 | 7/2003 | McAdams |
| 2003/0163774 A1 * | 8/2003 | Parrish ............... 714/728 |
| 2004/0237014 A1 * | 11/2004 | Bhatia ............... 714/726 |
| 2005/0015689 A1 * | 1/2005 | Eppensteiner et al. ....... 714/724 |
| 2005/0268190 A1 | 12/2005 | Kapur et al. |
| 2007/0011542 A1 * | 1/2007 | Mukherjee et al. ........... 714/738 |
| 2007/0100586 A1 * | 5/2007 | Cheng et al. ............... 702/185 |
| 2007/0113128 A1 | 5/2007 | Gizdarski |
| 2007/0234169 A1 * | 10/2007 | Rajski et al. ............... 714/742 |
| 2007/0300116 A1 * | 12/2007 | Casarsa ............... 714/738 |
| 2008/0052578 A1 * | 2/2008 | Rajski et al. ............... 714/729 |
| 2008/0133987 A1 * | 6/2008 | Rajski et al. ............... 714/719 |
| 2008/0195346 A1 * | 8/2008 | Lin et al. ............... 702/119 |
| 2008/0235544 A1 * | 9/2008 | Lai et al. ............... 714/729 |
| 2008/0294953 A1 * | 11/2008 | Cheng et al. ............... 714/726 |

OTHER PUBLICATIONS

S. Kirkpatrick; C. D. Gelatt; M. P. Vecchi, "Optimization by Simulated Annealing", Science, New Series, vol. 220, No. 4598. (May 13, 1983), pp. 671-680, incorporated herein by reference.

DFT MAX Adaptive Scan Compression Synthesis, datasheet 08/07. VR.WO 07-15756, 4pp.

TetraMAX ATPG Users Guide, Version 2002.05, Synopsys publication, May 2002, Document Order No. 37043-000 MA, 666 pp.

DFT MAX Backgrounder, Next Generation Scan Synthesis, May 2006, Synopsys publication 4/06.CE.WO.06-14431, 6 pp.

Agrawal V. et al., "Fault Sampling Revisited," IEEE Design & Test of Computers, Aug. 1990, pp. 32-35.

Venkataraman S. et al., "Diagnostic Simulation of Sequential Circuits Using Fault Sampling," IEEE 1997, pp. 476-481.

Goncalves F.M., et al., "Sampling Techniques of Non-Equally Probably Faults in VLSI Systems," 6 pp.

Rohit K. et al., "Historical Perspective on Scan Compression," Design & Test of Computers, IEEE vol. 25 (2), Mar.-Apr. 2008, pp. 114-120.

Agrawal V., "Sampling Techniques for Determining Fault Coverage in LSI Circuits," Journal of Digital Systems 5(3):189-202, 1981.

Box G. et al., "On the Experimental Attainment of Optimum Conditions" (with discussion), Journal of the Royal Statistical Society Series B 13(1):1-45, 1951.

International Search Report issued Nov. 5, 2009 for PCT/US2009/042367.

Extended EP Search Report mailed Oct. 17, 2012 in EP 09 80 0722 5pp.

Rammath S et al., "Test-Model based Hierarchical DFT Synthesis," IEEE/ACM Int'l Conf. on Computer Aided Design Digest of Technical Papers, Nov. 2002, pp. 286-293.

Wohl p. et al., "Fully X-tolerant Combinational Scan Compression," Int'l Test Conf., Oct. 2007, pp. 1-10.

* cited by examiner

TEST DESIGN OPTIMIZER FOR CONFIGURABLE SCAN ARCHITECTURES

BACKGROUND

The present invention relates to scan chain test architectures for integrated circuits, and in particular to optimization of the test architecture in dependence upon the circuit design.

Larger and more complex logic designs in integrated circuits (ICs) lead to demands for more sophisticated testing to ensure fault-free performance of those ICs. This testing can represent a significant portion of the design, manufacture, and service cost of ICs. In a simple model, testing of an IC can include applying multiple test patterns to the inputs of a circuit and monitoring its outputs to detect the occurrence of faults. Fault coverage indicates the efficacy of the test pattern in detecting each fault in a universe of potential faults. Thus, if a set of patterns is able to detect substantially every potential fault, then fault coverage approaching 100% has been achieved.

To facilitate better fault coverage and minimize test cost, DFT (design-for-test) has been used. In one DFT technique, structures in the logic design can be used. Specifically, a logic design implemented in the IC generally includes a plurality of state registers, e.g. sequential storage elements like flip-flops or latches. These state registers can be connected into scan chains of computed lengths, which vary based on the design. In one embodiment, all state registers in the design are scannable, i.e. each state register is in a scan chain. The state registers in the scan chains are typically called scan cells. In DFT, each scan chain includes a scan-input pin (also called a scan input herein) and a scan-output pin, which serve as a control and observation node during scan mode.

The scan chains are loaded with the test pattern by clocking in predetermined logic signals through the scan cells. Thus, if each scan chain includes 500 scan cells, then 500 clock cycles are used to complete the loading process. Note that, for simplicity, some embodiments described herein have scan chains of equal length. In actual embodiments, DFT attempts to create, but infrequently achieves, this goal. Thus, in actual embodiments, software can compensate for the different scan chain lengths, thereby ensuring that outputs from each test pattern are recognized and analyzed accordingly. This methodology is known to those skilled in the art and therefore is not explained in detail herein.

Typically, the more complex the design, the more flip-flops are included in the design. Unfortunately, with relatively few inputs and outputs of the design that can be used as terminals for the scan chains, the number of flip-flops per scan chain has increased dramatically. As a result, the time required to operate the scan chains, called herein the test application time, has dramatically increased.

FIG. 1 illustrates pertinent portions of a typical logic design for a sequential circuit. It includes combinational logic 110 and a number of state registers 112-0, 112-1, 112-2, and 112-3 (collectively 112). As used herein, the term "combinational logic" includes direct connections, so the logic paths through combinational logic 110 may include some that are mere wires, without any intervening alteration of the logic signals they carry. Only four state registers are shown in FIG. 1, but many designs have thousands or millions of state registers. A number of primary logic inputs PI0, PI1 and PI2 are provided to the combinational logic 110, as are a number of state register outputs Q0, Q1, Q2 and Q3. The outputs of combinational logic 110 include primary outputs PO0, PO1 and PO2, as well as next-state inputs D0, D1, D2 and D3 being provided to the state registers 112. While the illustration of FIG. 1 is not usually indicative of the physical positioning of components on an integrated circuit chip, all synchronous circuit designs can be drawn as shown.

The illustration of FIG. 1 also organizes the state registers 112 into two scan chains 114-0 and 114-1 (collectively 114). Scan chain 114-0 includes state registers 112-0 and 112-1, whereas scan chain 114-1 includes state registers 112-2 and 112-3. It can be seen that in scan chain 114-0, state register 112-0 has a separate scan input connected to a scan input SI0 of scan chain 114-0, and state register 112-1 has a separate scan input connected to the output Q0 of state register 112-0. The output Q1 of state register 112-1, in addition to being connected to combinational logic 110, is also provided to a scan output SO0 of scan chain 114-0. Similarly, it can be seen that in scan chain 114-1, state register 112-2 has a separate scan input connected to a scan input SI1 of scan chain 114-1, and state register 112-3 has a separate scan input connected to the output Q2 of state register 112-2. The output Q3 of state register 112-3, in addition to being connected to combinational logic 110, is also provided to a scan output SO1 of scan chain 114-1. Typically many more than two state registers are included in each scan chain, but for simplicity of illustration only two are shown in each scan chain in FIG. 1.

The device is designed to operate selectably in either of two modes, sometimes referred to herein as operating mode and scan mode. In the operating mode, the next-state data for the state registers 112 are taken from the outputs D0-D3 of combinational logic 110. In this mode the scan chains are inactive. In scan mode, the next-state data for state registers 112 are taken from the scan input of the respective state register.

FIG. 2 is another view of a portion of the design of FIG. 1, including two of the state registers 112-0 and 112-1, and portions of combinational logic 110. It can be seen that multiplexers 222 at the D input to flip-flops 223 within each of the state registers 112 are inserted to select between the respective D input from combinational logic 110 and the scan input from SI0 or from the previous state register 112 in the scan chain. The connections from register outputs of previous elements in the scan chain to the multiplexer 222 inputs, as well as the connections to scan input and output pins such as SI0 and SO0, are collectively designated 224 in FIG. 2. Using a scan_mode (i.e. a control) signal, multiplexers 222 can be configured to allow scan-in values to be shifted into flip-flops 223 without going through combinational logic 110. A pulse applied to the clock (CLK) terminals of flip-flops 223 will either capture values output from combinational logic 110, if the device is in operating mode, or will shift values from scan input SI0 into the scan chain, if the device is in scan mode. At the same time that it shifts values into the scan chain from scan input SI0, it also shifts values presently in the state registers 112, out via scan output SO0. Part of the process of "implementing" the scan chains involves replacing registers such as D flip-flops 223 in the circuit design, with register/multiplexer combinations like scan registers 112, and adding the scan chain interconnects 224.

FIG. 3 illustrates a standard flow 300 for processing a single scan test pattern for a particular device under test. In flow 300, step 301 sets the device in scan mode. Step 302 shifts the scan-in values into the active scan chains. Step 303 exits scan mode, returning the device to operating mode. Step 304 applies additional stimulus to the test circuit inputs PI0-PI2. As used herein, the stimulus includes both the values applied to the primary inputs PI0-PI2, as well as those shifted into the scan chains. The stimulus for a particular test iteration is also sometimes referred to herein as a test pattern or test vector. Step 305 pulses the clocks to capture the response of the device under test in the state registers 112. Step 306 sets the device again into scan mode, and step 307 shifts the scan-out values from the active scan chains. Step 308 again sets the device into operating mode. The response of the device to the test stimulus, and that is processed by external equipment in order to detect faults in the device under test, can include values that were scanned out in step 307 as well as values monitored on the primary outputs PO0-PO2.

Notably, steps 301, 303-306, and 308 take only one clock period on the tester. However, each shift operation, e.g. steps 302 and 307, take as many clock periods as the longest scan chain. In a complex design, upwards of a million flip-flops may be included. Assuming that only 10 scan chains can be provided, each scan chain would then have 100,000 (1,000,000/10) flip-flops, thereby requiring 100,000 clock cycles to process a single scan test pattern. Therefore, irrespective of any optimization achieved by overlapping scan operations of adjacent test patterns, test application time is dominated by the scan operation.

Deterministic automatic test pattern generation (ATPG) can be used to generate a set of test patterns for use in testing devices made according to a particular circuit design. ATPG operates generally by analyzing the circuit design and identifying a complete set of potential "faults", and then attempting to generate a minimum set of test patterns needed to test for a maximum set of the potential faults. Ideally, fault coverage is close to 100%, but for a complex circuit design, this can require significant storage area in the test-application equipment for the large number of patterns to be applied as stimulus as well as for the expected response values for each test pattern. ATPG software often can combine testing for multiple faults using a single test pattern, but the number of test patterns required can still be very large.

Some conventional test architectures take advantage of the observation that to detect any particular fault, typically only a limited number of positions in the test pattern need be set. For typical test patterns, only 2% of the stimulus values are needed. For the remainder of the test pattern, the values applied make no difference to the process of detecting that fault. In notational shorthand when designing the test patterns, positions in the test pattern that play no part are referred to as "don't care" positions, and are often represented with a logic X rather than a 0 or a 1.

In certain newer test architectures, each device scan input is connected to a number of scan chain inputs. In a design having N scan chains and m device scan inputs, each scan-in value is provided to N/m scan chains. The shared scan-in values therefore allow for many shorter scan chains compared to conventional scan architectures. In this way, the state registers in the device could be organized into a much larger number of parallel scan chains, than the number of device inputs available for use as device scan inputs. With a 4-way share, for example, test time per device could be reduced by nearly a factor of 4.

When using such a scan architecture, however, test vectors must be chosen carefully to avoid conflicts. A conflict occurs when the test vector prescribes one value to be applied to a state register at one position in one of the scan chains, and the opposite value to be applied to the state register at the same position in a different one of the scan chains that share the same device scan input. Such a conflict often can be avoided by known methods such as by re-designing the test patterns (so that at each particular position of a scan chain, either a common value or a don't care appears in all the scan chains that share the same device input), or by changing the assignment of scan chains to device scan inputs, or by changing the sequence of state registers within a scan chain, or by changing the assignment of state registers to scan chains. But if none of these options are available, then either a different scan architecture is required or less than full fault coverage must be accepted.

In Kapur et. al. U.S. Pre-grant Patent Publication No. 2005/0268190 ("Kapur et. al."), incorporated herein by reference, a technique is described in which the scan-in test architecture is dynamically reconfigurable as needed for a each shift of each test pattern. A "decompressor" is inserted between the device scan inputs and the scan chains, which is operable in a number of different modes for delivering device scan input values (or values derived therefrom) to the scan chains. For each shift of the scan chain within a test pattern, the tester sets the decompressor into the proper mode required for that particular position of the test vector.

Logic added to interface device scan inputs with the internal scan chains is referred to as a decompressor; this is because it takes only a few input values to supply a much larger set of receiving scan chains. Logic added to interface the internal scan chain outputs to the device scan outputs is referred to as a compressor, as it takes many values from the scan chains and funnels them to a much smaller set of device scan outputs. Sometimes test vectors produce a response in scan out positions which are unpredictable logic values. These unpredictable logic values could come from un-initialized memory elements, or from bus-contention or unpredictable timing related issues. These scan out positions will have an unknown value whether or not the relevant faults exist. These unknowns, which like the "don't cares" in the test vectors themselves, are sometimes notated as Logic-X's (unknowns). They can have a negative impact on the observability of good responses that are coming together in the compressor.

The X's generated during response capture can be proactively blocked from reaching the scan cell by identifying the X-sources and then removing them or by inserting additional DFT logic to fix the X-sources by adding additional test points. Another known way to block the Xs from reaching the scan cells is by careful test pattern generation where the don't-care bits in the scan-in vector can be set to control values to block the Xs from reaching the scan cell. In another solution, error masking and/or X-masking can be used. Error masking involves carefully designing the compressor so that multiple errors cancel each other out, and X-masking involves inserting masking logic between the scan chain outputs and the compressor in order to prevent an X from propagating to the compactor output. FIG. 4 shows an example of masking logic for a compressor that has redundancy in the XORs of the compressor. In this example, the masking logic ensures that within any group of scan chains that are observed the logic-X's in the response captured in any of the scan cells does not interfere in the observability of the scan cells in other scan chains. Masking can introduce its own problems, however, since it reduces observability in the design. The test pattern count therefore tends to increase for the same fault coverage, thereby partially countering the savings achieved by using an output compressor.

A large variety of solutions have been developed also for the interfacing logic on the input side of the scan chains. A survey of some of them is set forth in N. A. Touba, "Survey of Test Vector Compression Techniques", IEEE Design and Test of Computers, July-August 2006, pp. 294-303, incorporated by reference herein. They include Code-based Schemes, Linear-decompressor-based schemes and Broadcast-scan-based schemes. These solutions can be categorized as either combinational or sequential. The combinational solutions can be as simple as direct (but shared) connections of device scan inputs to the internal scan chains, or as complex as decoding logic to unravel scan data to sequence of 1's and 0's. The more common solutions use XORs on the input or MUXes to distribute values from the device scan inputs to the receiving scan chains. The sequential solutions include some which are mutations of the Logic BIST structure tailored for scan compression. With seeds streaming in at intervals, or on every shift, the stimulus requirements for fault detection and observation (masking) are encoded to provide significant gains in test data volume and test application time. The sequential solutions also include those that use shift registers to temporarily store multiple values that get applied with various spreading logic.

Most modern integrated circuit design processes make use of Electronic Design Automation (EDA) tools. Various EDA vendors provide their own solutions by automatically (1) organizing the state registers of a provided circuit design into scan chains, and (2) inserting their own flavor of predetermined compression and decompression logic before and after the scan chains. The organization of state registers into scan chains and the compression and decompression logic, together with certain configuration settings provided to the ATPG system for the development of test vectors, are sometimes referred to collectively herein as the "test design" of a circuit design. EDA software allows the user some choices in this process, such as the allocation of device I/O pins between scan input and scan output functions, the number of modes to be implemented in the decompressor, whether output masking should be implemented, and so on. However, since users are typically ill-equipped to answer these questions in any meaningful way, users typically merely accept the software's default settings, which usually represent the optimal answer for some "average" circuit design. As a result, since no real-world circuit design is "average", the test designs implemented for many circuit designs are sub-optimal, either in data volume or fault coverage or both.

SUMMARY

Roughly described, the invention involves optimizing a scan-based test architecture for a provided circuit design in dependence upon the circuit design itself. In one embodiment, a plurality of candidate test designs for the circuit design are developed. For each candidate test design, a plurality of test vectors are generated in dependence upon the circuit design and the candidate test design, preferably using the same ATPG algorithm that will be used downstream to generate the final test vectors for the production integrated circuit device. A test protocol figure of merit such as fault coverage is determined for each of the candidate test designs, and one of the candidate test designs is selected for implementation in an integrated circuit device in dependence upon a comparison of such test protocol figures of merit. Preferably, only a sampling of the full set of test vectors that ATPG could generate, is used to determine the number of potential faults that would be found by each particular candidate test design.

Particular aspects of the present invention are described in the claims, specification and drawings.

BRIEF DESCRIPTION OF THE DRAWINGS

The invention will be described with respect to particular aspects thereof, and reference will be made to the drawings, in which.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Overview of Design and Test Flow

Figure 1:
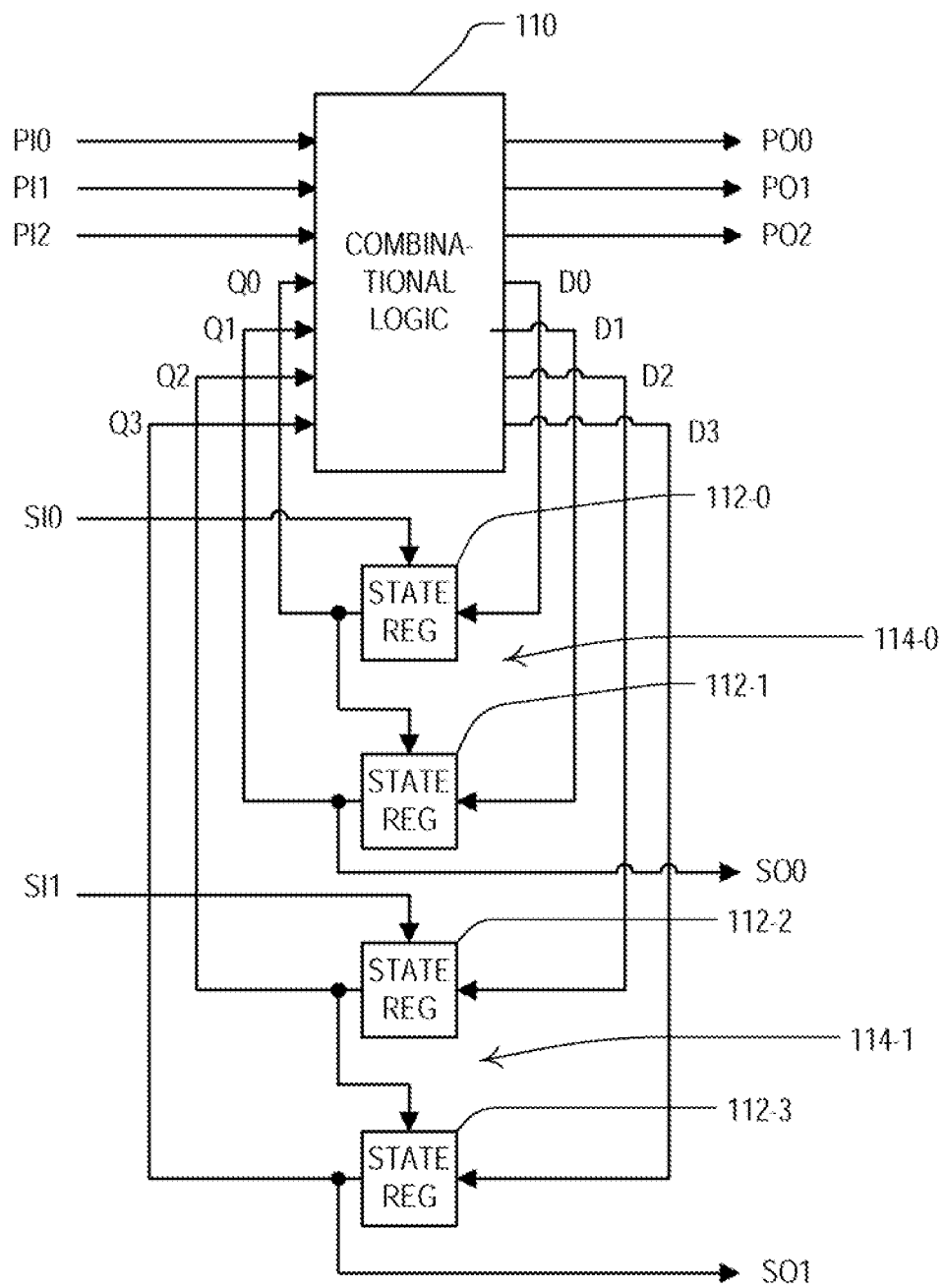
FIG. 1 illustrates portions of a typical logic design for a sequential circuit.
Figure 2:
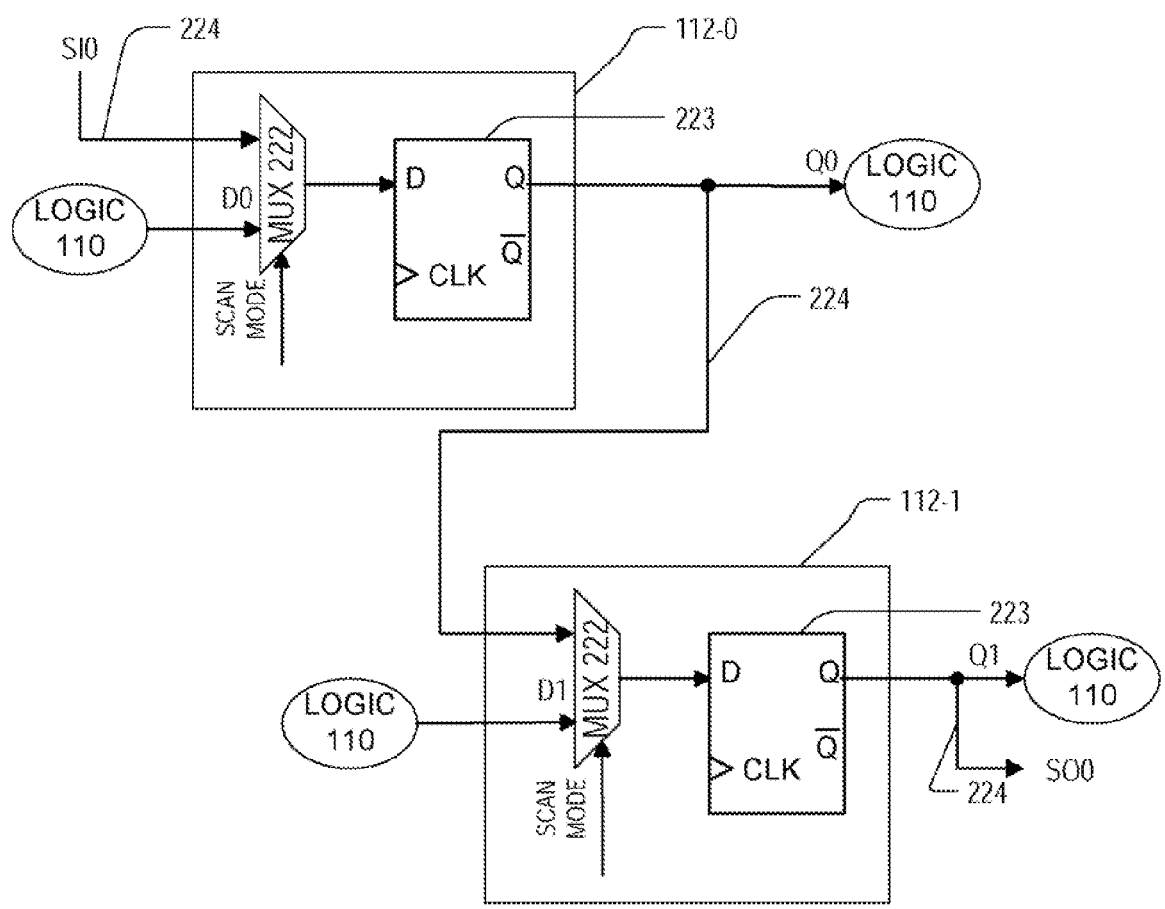
FIG. 2 is another view of a portion of the design of FIG. 1.
Figure 3:
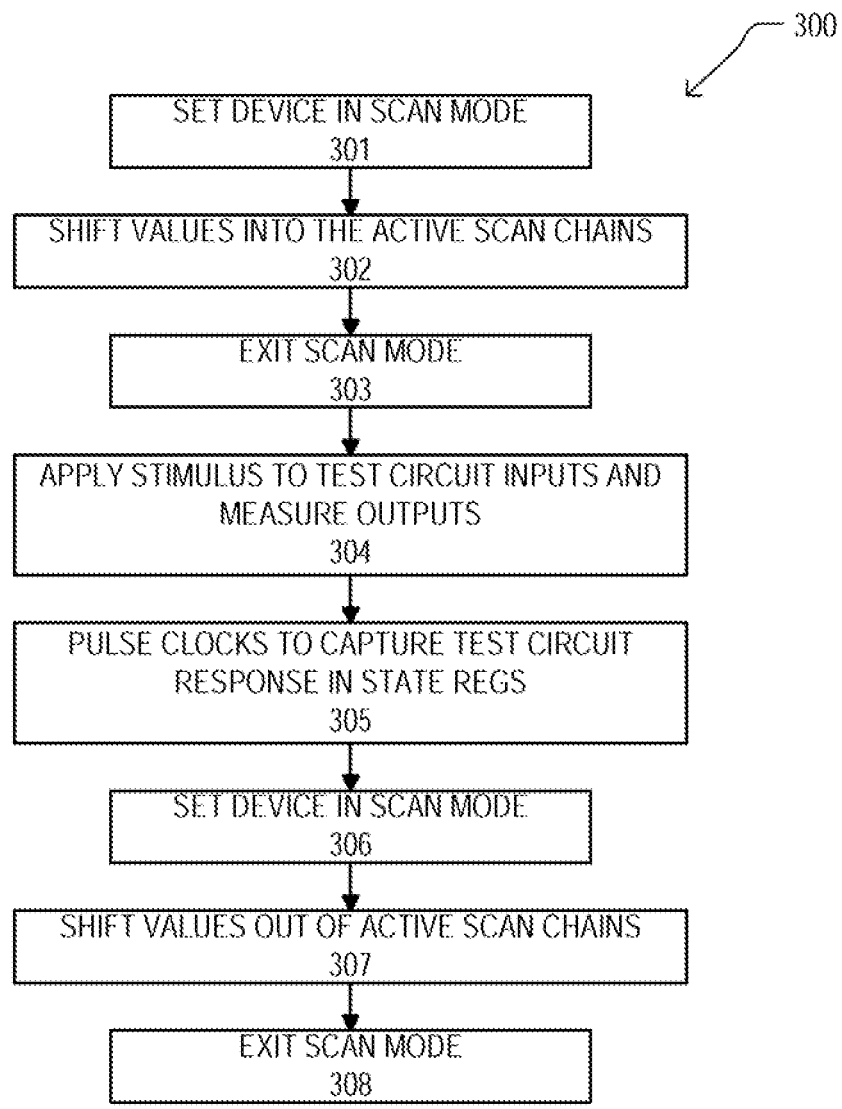
FIG. 3 illustrates a flow for processing a single scan test pattern for a particular device under test.
Figure 4:
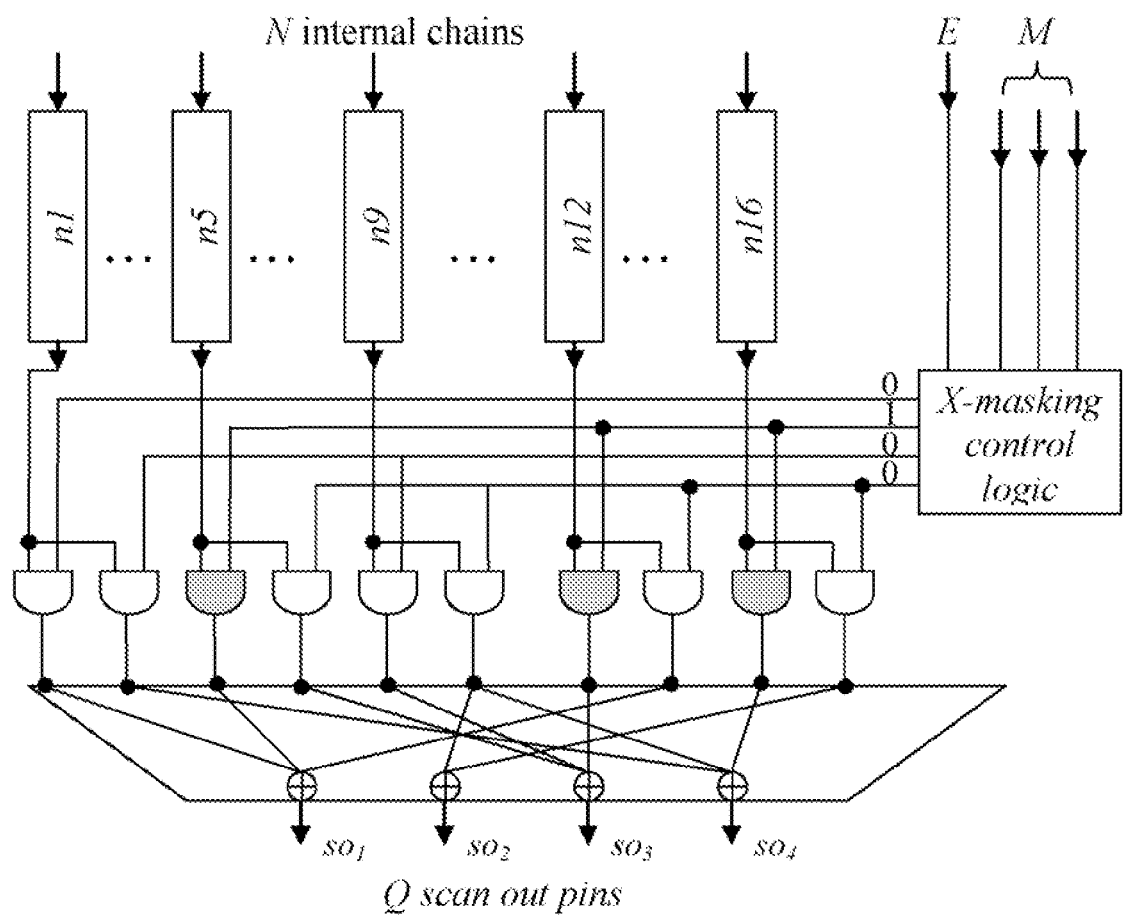
FIG. 4 shows an example of masking logic for a compressor.
Figure 5:
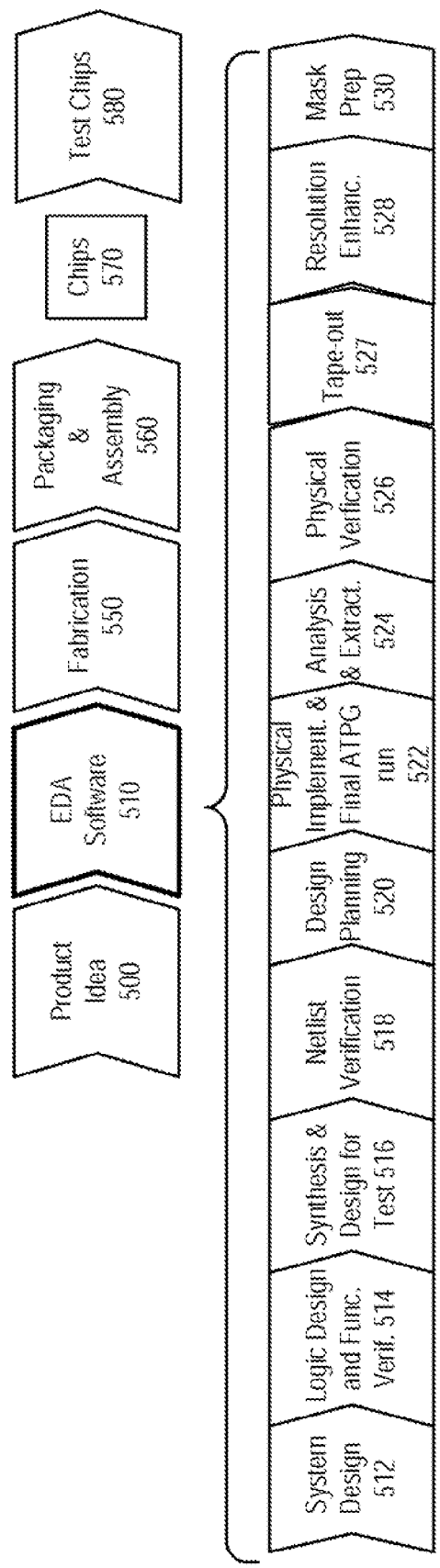
FIG. 5 shows a simplified representation of an illustrative digital integrated circuit design and test flow.

FIG. 5 shows a simplified representation of an illustrative digital integrated circuit design and test flow. As with all flowcharts herein, it will be appreciated that many of the steps in FIG. 5 can be combined, performed in parallel or performed in a different sequence without affecting the functions achieved. In some cases a re-arrangement of steps will achieve the same results only if certain other changes are made as well, and in other cases a re-arrangement of steps will achieve the same results only if certain conditions are satisfied. Such re-arrangement possibilities will be apparent to the reader.

At a high level, the process of FIG. 5 starts with the product idea (step 500) and is realized in an EDA (Electronic Design Automation) software design process (step 510). When the design is finalized, the fabrication process (step 550) and packaging and assembly processes (step 560) occur resulting, ultimately, in finished integrated circuit chips (result 570). Some or all of the finished chips are tested in step 580 on a tester machine using predefined test vectors and expected responses.

The EDA software design process (step 510) is actually composed of a number of steps 512-530, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 510) will now be provided.

System design (step 512): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 514): At this stage, the VHDL or Verilog code for modules in the system is written and the design is checked for functional accuracy. More specifically, the design is checked to ensure that it produces the correct outputs in response to particular input stimuli. Example EDA software products from Synopsys, Inc. that can be used at this step include VCS, VERA, DesignWare®, Magellan, Formality, ESP and LEDA products. At this stage of development, the design is sometimes referred to herein as a "logic design" or a "circuit design". While some designs might at this stage already include certain design-for-test features such as scan chains and associated scan compression or decompression circuitry, these are not included in the terms "logic design" and "circuit design" as they are used herein.

Synthesis and design for test (DFT) (step 516): Here, the VHDL/Verilog is translated to a netlist. The netlist can be optimized for the target technology. Additionally, the implementation of a test architecture occurs in this step, to permit checking of the finished chips. Example EDA software products from Synopsys, Inc. that can be used at this step include Design Compile®, Physical Compiler, Test Compiler, Power Compiler, FPGA Compiler, TetraMAX, and DesignWare® products. A current product for implementing a test architecture, with a few user-specified configuration settings as described above, is DFT MAX. DFT MAX is described in Synopsys, DFT MAX Adaptive Scan Compression Synthesis, Datasheet (2007), incorporated herein by reference. Aspects of the present inventions can be inserted in this step, after synthesis and before DFT.

Netlist verification (step 518): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 520): Here, an overall floor plan for the chip is constructed and analyzed for timing and top-level routing. Example EDA software products from Synopsys, Inc. that can be used at this step include Astro and IC Compiler products.

Physical implementation (step 522): The placement (positioning of circuit elements) and routing (connection of the same) occurs at this step. Example EDA software products from Synopsys, Inc. that can be used at this step include the Astro and IC Compiler products. A final ATPG run typically occurs during this step, to develop the database of test vectors (including compression mode selection bits) and expected responses for use in testing the chip. An example of ATPG software which can be used with aspects of the invention is TetraMAX®, described in Synopsys, TetraMAX® User (Guide, Version 2002. 5 May 2002, incorporated herein by reference in its entirety.

Analysis and extraction (step 524): At this step, the circuit function is verified at a transistor level, this in turn permits what-if refinement. Example EDA software products from Synopsys, Inc. that can be used at this step include AstroRail, PrimeRail, Primetime, and Star RC/XT products.

Physical verification (step 526): At this step various checking functions are performed to ensure correctness for: manufacturing, electrical issues, lithographic issues, and circuitry. Example EDA software products from Synopsys, Inc. that can be used at this step include the Hercules product.

Tape-out (step 527): This step provides the "tape-out" data for production of masks for lithographic use to produce finished chips. Example EDA software products from Synopsys, Inc. that can be used at this step include the CATS® family of products.

Resolution enhancement (step 528): This step involves geometric manipulations of the layout to improve manufacturability of the design. Example EDA software products from Synopsys, Inc. that can be used at this step include Proteus, ProteusAF, and PSMGen products.

Mask preparation (step 530): This step includes both mask data preparation and the writing of the masks themselves.

Example Test Architecture

As mentioned, several different test architectures are available from different EDA vendors. Most or all of them can benefit from the application of aspects of the present invention. For simplicity of illustration, the architecture used in the embodiments described herein is that available from tools offered by Synopsys, Inc., Mt. View, Calif.; but it will be understood that the invention applies equally well to architectures available from other vendors. As used herein, a test "architecture" is the total class of test "designs" that are made available in a particular software package. The test "architecture" is the structure that becomes customized into a particular test "design" after the various design choices made available by the test "architecture" are fixed. In the test architecture of the present embodiment, many parameters are available for customization. As used herein, a "parameter" is merely a container for a value. Thus a "test architecture" includes unfilled parameters, and once the parameters are filled with values, a "test design" is defined.

Figure 6:
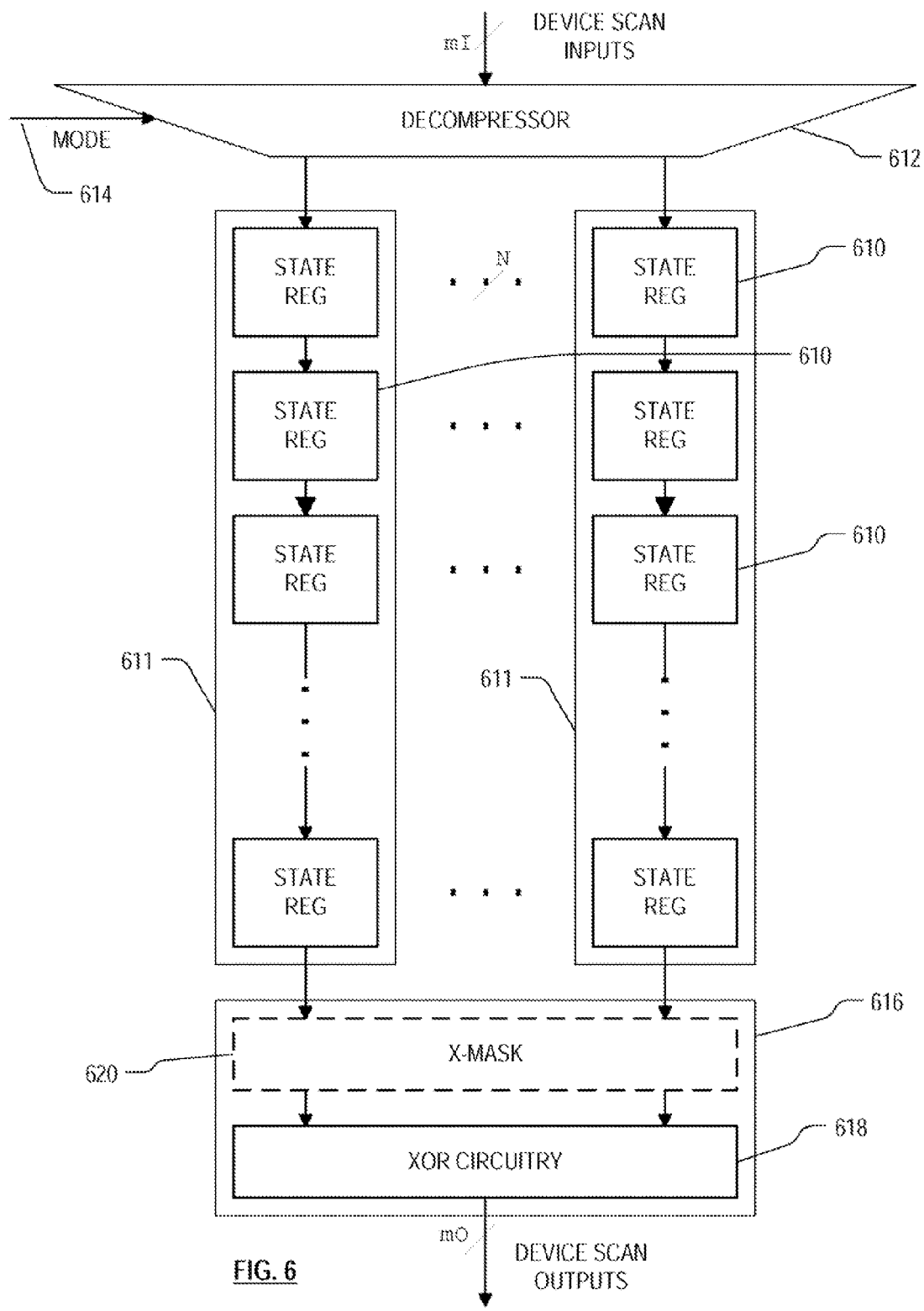
FIG. 6 illustrates a test architecture used in the embodiments described herein.

FIG. 6 illustrates the test architecture used in the embodiments described herein. It can be seen that the state registers 610 are organized into N scan chains 611. The scan chains 611 in a particular test design need not have equal length, though equal length is desirable. The scan inputs to the scan chains 611 are driven by a decompressor 612, inputs of which are connected to mI device scan inputs of the device. The logic by which the decompressor 612 forms the values to be provided to the N scan chain inputs is affected by a mode selection input 614, which could include several bits. The scan outputs of the scan chains 611 are provided to a compressor 616, which derives therefrom a set of mO device scan outputs. The compressor 616 includes XOR circuitry 618, and may include, depending on design choices, X-Mask logic 620 between the scan chain outputs and XOR circuitry 618.

The decompressor 612 is configurable to provide a plurality of operating modes, selectable via the mode input 614. Each mode defines a specific routing of signals from the device scan inputs (or their logical complements) to the scan chain inputs. That is, the selection of a particular one of the predefined modes establishes which device scan input feeds each scan chain input, and whether it is to be complemented first. In the present embodiment, the decompressor 612 is implemented with a multiplexer at the head of each scan chain input. Each multiplexer has a number of inputs. The first input of each multiplexer, which in a particular design may be either inverting or non-inverting, is connected to receive the value from the particular device scan input that the respective scan chain is to receive in the first mode of operation. Similarly, the second input of each multiplexer, which again may be either inverting or non-inverting in the particular design, is connected to receive the value from the particular device scan input that the respective scan chain is to receive in the second mode of operation; and so on. It will be appreciated that in a different test architecture, a wide variety of circuit elements, combinational and/or sequential, can be made available for use in a particular test design.

The test architecture of the present embodiment offers numerous configuration parameters. The parameters include those that can be categorized as primary parameters, macro parameters, or ATPG parameters. As used herein, a primary parameter is one that establishes a corresponding feature on the resulting device. Examples include:

number of scan chains assignment of state registers to scan chains sequence of state registers within a scan chain number of I/O pins allocated to mode selection number of available decompression modes (if number of pins allocated to mode selection has been previously fixed)

allocation of remaining available I/O pins to (a) scan inputs and (b) scan outputs whether inversions are included in the decompressor, and if so, on which scan inputs assignment of inputs (and their inversions, if any) to individual multiplexer inputs whether masking is implemented in compression circuitry configuration of the mask, if masking is implemented in compression circuitry A macro parameter, as used herein, is one that does not itself appear directly on the device, but rather, implies values for a set of one or more of the primary parameters, which do appear on the resulting device. Examples include:

number of available decompression modes (if number of pins allocated to mode selection is to be varied)

This macro parameter determines the number of pins allocated to mode selection, the remaining ones of the available pins being allocable as scan inputs and scan outputs Maximum compression to target This macro parameter determines the number of internal scan chains. If a greater compression is permitted, then there can be more internal chains. Test time and test data volume will be reduced, but there will be a greater probability of faults that cannot be detected.

Whether response X's are to be moved into separate chains which are observed under a separate mask condition, and what % of analysis One strategy to increase observability of faults is to move into a separate scan chain, all state registers most likely to carry response value unknowns when the test vectors are designed. This is accomplished by simulating random tests of the circuit design and selecting for the separate scan chain all state registers which carry a response value unknown in at least some predetermined percentage of the random tests, for example 25%. This percentage is the % of analysis in this macro parameter.

This macro parameter affects at least the following primary parameters: whether masking is implemented in the compression circuitry, configuration of the mask, and assignment of state registers to scan chains.

extent of X-tolerance

Another strategy to increase observability of faults is to provide redundant paths from the internal scan chains to device scan output pins. This reduces the probability of an X in the response to a test pattern spoiling observability of the fault. The extent of X-tolerance determines the extent of redundant connections implemented.

This macro parameter affects whether masking is implemented in the compression circuitry, the configuration of the mask if so, and the assignment of state registers to scan chains.

An ATPG parameter, as used herein, is one that is used to configure the ATPG software in the Physical Implementation step 522. Some ATPG parameters are themselves configuration parameters for the ATPG run, whereas others merely imply one or more other configuration settings for ATPG. ATPG parameters do not affect any features on the device itself. Examples include:

Whether to disturb circuit design clock groupings (whether interacting clock domains are permitted to be pulsed together during test, for circuit designs in which state registers are assigned to separate domains for clocking purposes).

Abort limit for ATPG. The Abort limit controls the number of attempts that ATPG is permitted to make in order to find a test pattern to test for a particular fault.

Merge effort for ATPG. The Merge Effort parameter controls the amount of effort that ATPG is permitted to make in order to test for more than one fault using a single test pattern.

Test Design Optimizer

As mentioned, DFT and ATPG software may offer numerous options to the user for governing the development of a test design, but users are typically not able to select values for the various options intelligently. As a result, users typically merely accept the default settings offered by the software, which were chosen by the DFT and ATPG software vendor as providing optimum results for some "average" circuit design. For example, compression and decompression are implemented with a scan terminal budget that may come from many sources, such as packaging constraints, tester constraints, design constraints, and manufacturing constraints in the use of multi-site testing. Given a total scan terminal budget, conventional software allows the user to allocate different numbers of device scan inputs and device scan outputs to be used by scan compression and decompression. A balanced use of the scan terminals across the inputs and outputs is typically a default decision by the tool or a user. However, depending on the design the compression achievable may be limited by dependencies created by the decompressor or the tolerance of unknowns in the compressor. Depending on the circuit design under consideration if the scan compression is limited by the input dependencies the test design should be bias toward allocating more device I/O pins as device scan inputs than device scan outputs. On the other hand, if unknowns in the responses are interfering in the observation of faults more device I/O pins should be allocated as device scan outputs than device scan inputs. As used herein, the term I/O "pin" refers to any externally accessible circuit node. It does not have to be a physical pin.

Parameters such as the allocation of device I/O pins to scan inputs vs. scan outputs are difficult to know how to fill, and as mentioned, users usually accept the defaults that are assumed to work for an average circuit design. As a result, the resulting test design is not likely to be optimum for the particular circuit design under consideration. This is true even if the user selected non-default values for some parameters, since users are not likely to know what values to select to optimize the test design for any particular circuit design.

A test design optimizer such as that described herein answers these questions by creating a virtualization environment and an evaluation strategy such that different configurations of the test architecture can be compared against each other to allow an optimum test design to be chosen. Since the test design optimizer includes the circuit design under test in the virtual environment, it has the effect of developing a test design that is optimized in dependence upon the specific circuit design under consideration, rather than some average circuit design. The result of a test design optimizer is a set of test design values to be used when building the actual test design. Any values determined by the optimizer for primary parameters and macro parameters are used during DFT step 516 to insert and connect scan chains (if not previously established), and to insert the compression and decompression circuitry. Any values determined by the optimizer for ATPG parameters are applied to the ATPG software in step 522 (FIG. 5) to control the generation of test vectors for the test design that by that point in the EDA flow has already been implemented. In one embodiment the ATPG parameters are applied automatically to ATPG, whereas in another embodiment they represent recommendations which the user can apply or not, as desired.

Figure 7:
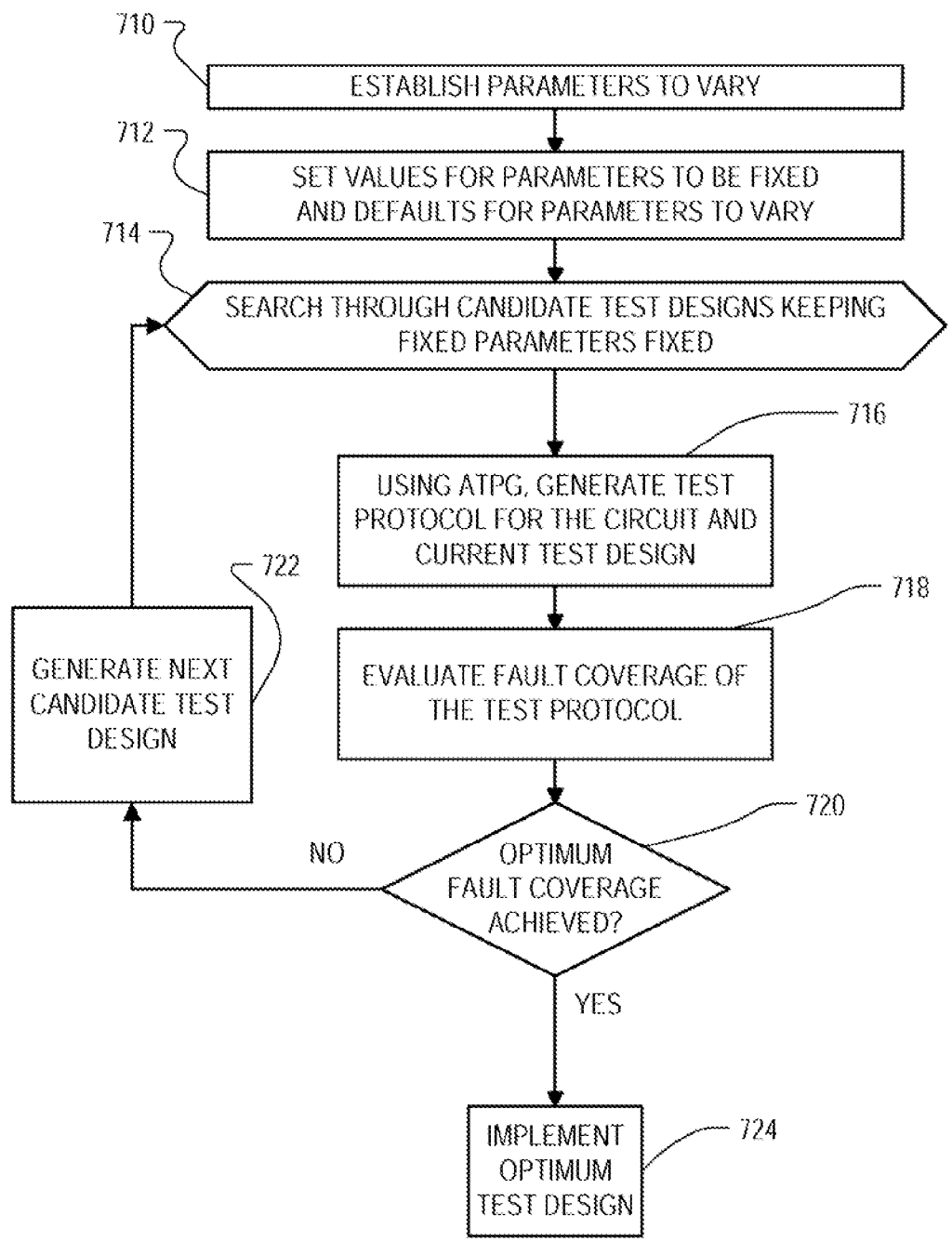
FIG. 7 is a flow chart of an embodiment of a test design optimizer incorporating features of the invention.

FIG. 7 is a flow chart of an embodiment of a test design optimizer incorporating features of the invention. Roughly described, it comprises an iterative search for the set of test parameter values which will yield an optimum test design for the circuit design under consideration. In step 710, it is established which parameters are to be fixed and which are to be varied. In one broad class of embodiments, the scan chains are fixed and not allowed to vary during the search. That is, parameters such as the number of scan chains, the assignment of state registers to scan chains, and the sequence of state registers within a scan chain, are all predefined and not allowed to vary. Such an embodiment might use a pre-existing product such as DFT MAX to develop the scan chains. In another embodiment, these parameters are not fixed, and are allowed to vary as part of the search. With regard to the example parameters listed above, in various embodiments, any or all of them as well as others can be varied during the optimization search. If a macro parameter is to be varied, then there is no need to separately vary the primary parameters that the macro parameter implies (unless the macro parameter implies only a restriction on values for the primary parameter, in which case the primary parameter can be varied during search within those restrictions.)

In step 712, values are established for those of the parameters that are to remain fixed during the search, and initial values are chosen for those parameters that will be allowed to vary. In one embodiment, the initial values are chosen as values which would be optimum in some circuit design deemed to be "average". As mentioned, for many parameters these values are already available and provided as default values that conventional software would offer to the user. Note that if the ATPG parameters are to be taken as ATPG software defaults and not varied, the step of setting such values in step 712 might not actually take place until step 716, when ATPG is actually used.

In step 714, a loop begins for searching through a plurality of candidate test designs. The first candidate test design is one implied by the parameter values set in step 712, and subsequent candidate designs are generated in dependence upon the particular search algorithm to be used. A wide variety of potential search algorithms are available for various embodiments; a particular example one is discussed below with respect to FIG. 8. The candidate test designs in a sense virtualize the circuit design and the circuitry of the test design in combination, so that the combination can be evaluated for its ability to detect faults.

In step 716, the combination circuit design and test design circuitry is provided to ATPG, preferably the same ATPG software that will be used as part of step 522 (FIG. 5) to generate final test vectors. In an embodiment, the software package known as TetraMAX is used in step 716. The ATPG configuration parameter values for the current candidate test design are provided to ATPG during this step 716, and ATPG proceeds to develop its optimum set of test vectors given those parameter values, and given the structure of the scan circuitry and the compression and decompression circuitry as established in the current candidate test design. ATPG produces a test protocol including a set of test vectors and the expected (i.e. non-faulty) response from each.

Roughly described, the ATPG algorithm used in TetraMAX operates by first creating a list of target faults, which may be for example that a connection or net is stuck-at-0 or stuck-at-1. For each target fault, ATPG then determines a set of input values that will create a "difference" at the fault site (one logic value at the fault site if the target fault exists and the opposite logic value at the fault site if the target fault does not exist). ATPG then "sensitizes" a path from the fault site to an observable point (scan register or primary output). "Sensitizing" involves identifying all the logic gates in the logic path to the observable point, and following other inputs of those logic gates backwards to determine what values need to be on the inputs in order for the difference to appear at the observable point. The set of input values required to inject a difference at the fault site and sensitize a path to an observable point is a test pattern, and the set of observable values expected when the fault does not exist is the expected response from that test pattern. If enabled, ATPG also attempts to merge each new test pattern with previously created patterns, since if two patterns can be successfully merged, the number of faults detected is increased without an increase in the number of patterns. If ATPG is allowed to run to completion, it will generate a large number of test patterns that together will find some large percentage of the target faults identified at the beginning of the ATPG algorithm.

In step 718, fault coverage of the test protocol determined by ATPG is evaluated. As used herein, "fault coverage" is defined as the ratio of the number of faults in the circuit design which are detected by the test protocol, to the total number of faults in the circuit design. In other embodiments, other test protocol quality measure can be used. One other example quality measure is "test coverage", which is the ratio of the number of faults in the circuit design which are detected by the test protocol, to the total number of faults in the circuit design which are detectable (e.g., excluding those which are undetectable because they are located on outputs that have no electrical connection to any other logic, those which are undetectable because they are located on pins that are tied permanently to a fixed logic value, those that are undetectable because they are located in redundant logic paths that mask the fault effect, and those that are undetectable because redundant logic paths hinder their control or observability.) Yet another example quality measure is "ATPG effectiveness", which is the ratio of the number of ATPG-resolvable faults to the total number of faults in the circuit design. Other quality measures will be apparent to the reader.

In step 720, it is determined whether optimum fault coverage has been achieved. In one embodiment of this step, the test design which is considered to yield optimum fault coverage is the current candidate test design. That is, the search narrows the choices down to the test design believed to be optimum. In another embodiment, the test design which is considered to yield optimum fault coverage can be some other candidate test design. That is, the search evaluates candidate test designs beyond the one ultimately considered optimum, so that the current candidate test design in step 720 is not the one considered optimum; it is merely the last one evaluated for its quality.

If in step 720 optimum fault coverage has not yet been achieved, then in step 722, the next candidate test design is generated and the process returns to step 714 to generate a new test protocol based on it. The algorithm by which the next candidate test design is generated depends on the search algorithm. For an exhaustive search, this step might simply involve incrementing the value of one of the test parameters.

For a more focused search, this step might take into account the quality measures of one or more previously evaluated candidate test designs, in order to hone in on an optimum.

If in step 720 optimum fault coverage has been determined to have been achieved, then in step 724, the process continues with the implementation of the optimum test design. Depending on which test parameters had been fixed in step 712, this can involve incorporating the circuit design and structural aspects of the test design together in a combined design. That can include replacement of the state registers in the circuit design with scan registers organized in accordance with the scan chains implied by the optimal test design parameter values, and/or it can include insertion of specific compression and/or decompression circuitry that are implied by the optimal test design parameter values. In either case, the result is reflected in the netlist brought forward to the next step in the EDA process, such as netlist verification step 518 (FIG. 5). It is also reflected in the version of the design supplied to ATPG for its final run in step 522. A full set of test vectors and expected responses are generated at that time and subsequently delivered to the testing equipment used in step 580. The result of implementation step 724 is also eventually reflected in the masks created in step 530, and the chips 570. Implementation of the optimum test design can also involve controlling the final ATPG run in step 522, in accordance with the configuration parameter values determined to be optimal for the final ATPG run. This portion of the test design is not reflected in the mask or chips, but is reflected in the test data sets (including test vectors and expected responses) delivered to chip testing equipment used to test the resulting chips in step 580.

It can be seen that many aspects of the test design can be optimized using a flow such as that shown in FIG. 7, including the structure of the scan chains, the structure of the decompressor and the compressor, as well as ATPG configuration parameters to obtain the optimum set of test vectors for the optimized test design. Users no longer need to guess at test parameter values, nor accept default values that may not be optimum for the particular circuit design under consideration.

It can also be seen that depending on the complexity of the circuit design under consideration, the number of test parameters to be allowed to vary during the search, and the efficiency of the search algorithm, an iterative search such as that shown in FIG. 7 can take a prohibitively long time. For example, ATPG can take many hours to develop a test protocol for a single test design for a relatively complex circuit design. Running ATPG to completion for each test design in a large search space would not be practical. In an embodiment, therefore, the step 716 of using ATPG to generate a test protocol preferably uses pattern sampling, and more preferably both pattern sampling and fault sampling, in order to make an iterative search such as that shown in FIG. 7 practical.

Figure 8:
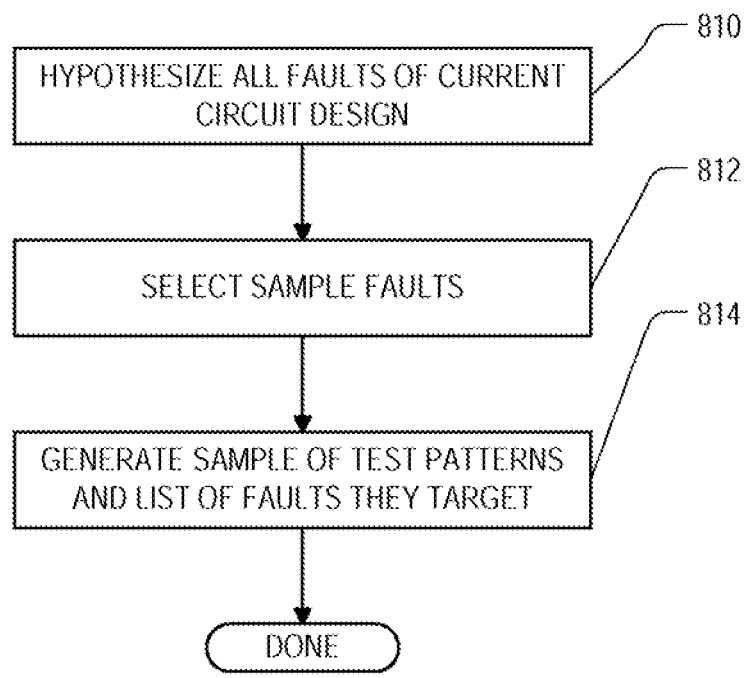
FIG. 8 is a flow chart of the step in FIG. 7 of using ATPG to generate a test protocol.

FIG. 8 is a flow chart of step 716 of using ATPG to generate a test protocol. In step 810, ATPG first identifies all potential faults in the circuit design. In particular, ATPG identifies every node that can be either stuck at 0 or stuck at 1, and every node that can be slow to rise or slow to fall, and any pair of adjacent nodes that can be bridged together.

In step 812, a sample of, for example 10% of the faults identified in step 810 are chosen. Preferably the fault samples are chosen so as to be evenly distributed physically over the chip.

In step 814, ATPG is used to generate test vectors targeting only the sample set of faults. However, ATPG is terminated after only a small sampling of test vectors have been generated. As used herein, a "sampling" of test vectors means fewer than the total number of test vectors that would be generated if ATPG were allowed to run to completion. Preferably, in an embodiment the sampling contains no more than 256 vectors. Even more preferably it contains no more than 128 test vectors, and even more preferably it contains no more than 64 test vectors. Preferably it is more than 32 test vectors, which does not appear to be sufficient for many designs. This is as compared to perhaps thousands or tens of thousands of test vectors that might be generated if ATPG were allowed to run to completion. The test vector sample size should be constant for all test designs in the search, so that the results can be validly compared to each other.

At the same time that ATPG generates test vectors, as a normal part of its process, it also generates a list of the target faults that will be found by the sample set of test vectors. The number of faults in the list is then used as the metric, in step 718, for evaluating fault coverage of the test protocol.

While fault sampling has been used in the industry before, pattern sampling has not. Pattern sampling relies on an assumption that the fault coverage seen by the first few patterns is monotonically related to the total percentage of faults that would be found by a full ATPG run on the complete set of faults identified by ATPG in step 810. More particularly, the method of FIG. 8 relies on an assumption that if ATPG can determine a test protocol for a particular test design, where the test protocol yields high fault coverage after only a few test patterns, then when ATPG is run to completion subsequently in step 522, targeting the full set of identified potential faults, the test protocol it determines will yield similarly high fault coverage (or the same fault coverage with fewer test vectors). This assumption is believed to be usually accurate, and in the few cases in which a different test design would have yielded better fault coverage, the amount of improvement is not very significant.

As mentioned, in step 714, a wide variety of different search algorithms can be used in different embodiments. In one embodiment an exhaustive search is made, trying all possible combinations of values for the test parameters that will vary during the search. An exhaustive search is most likely to yield the optimum test design, but typically it is not practical unless only a few of the test parameters are allowed to vary. It can become practical if a larger number of the test parameters are allowed to vary, if fault sampling is used and especially if pattern sampling is used. Other example search algorithms that can be used are simulated annealing, and Response Surface Methodology. Simulated annealing is described in S. Kirkpatrick; C. D. Gelatt; M. P. Vecchi, "Optimization by Simulated Annealing", Science, New Series, Vol. 220, No. 4598. (May 13, 1983), pp. 671-680, incorporated herein by reference. Response Surface Methodology is described in Box, G. E. P. and Wilson, K. B., "On the Experimental Attainment of Optimum Conditions (with discussion)", Journal of the Royal Statistical Society Series B 13(1):1-45. (1951), incorporated herein by reference.

Figure 9:
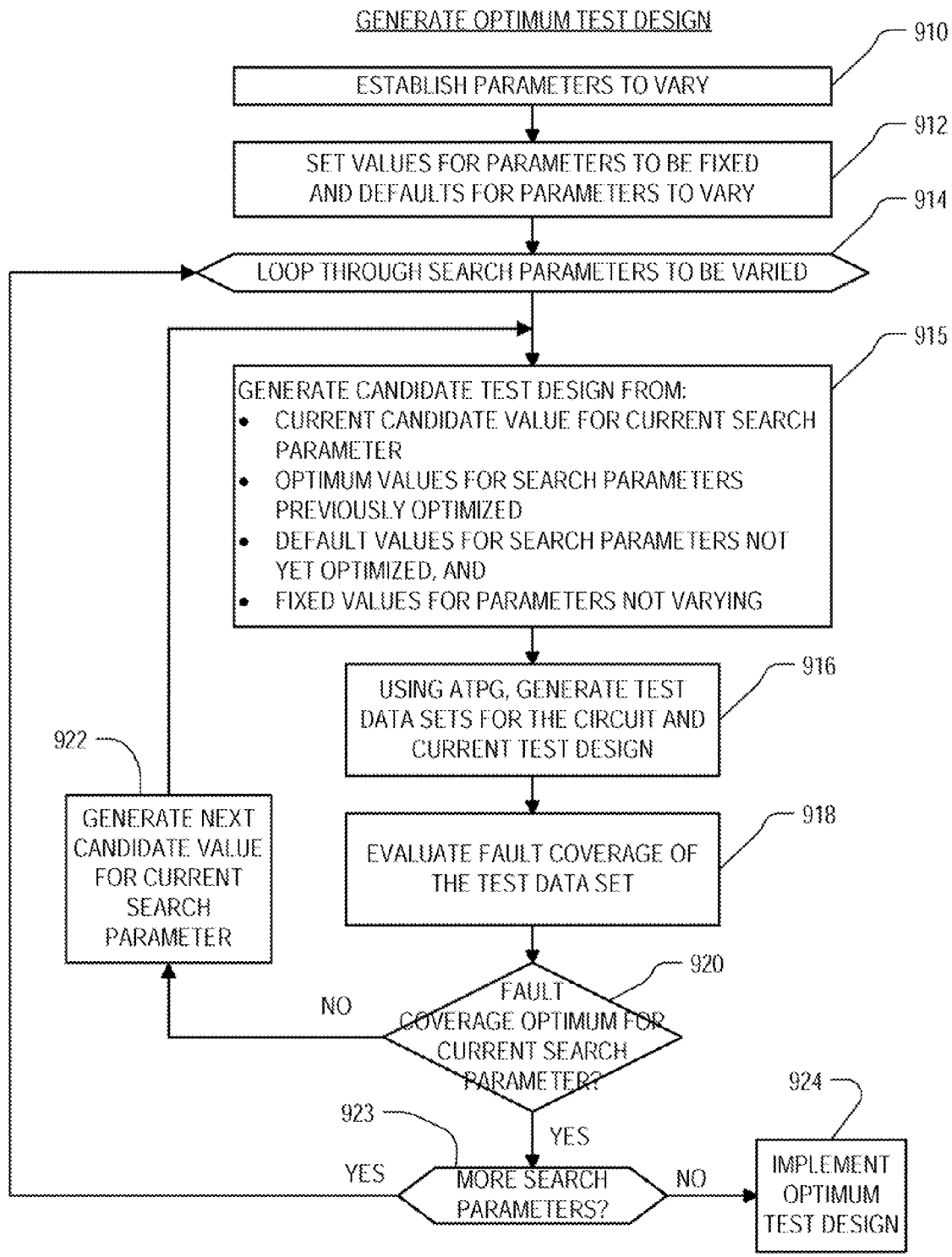
FIG. 9 is a flow chart of an embodiment of a test design optimizer incorporating features of the invention.

FIG. 9 is a flow chart of an embodiment in which the search operates by first optimizing one parameter and then moving on to the next. In step 910, it is established which parameters are to be fixed and which are to be varied. As in the embodiment of FIG. 7, if a macro parameter is to be varied, then there is no need to separately vary the primary parameters that the macro parameter implies (unless the macro parameter implies only a restriction on values for the primary parameter, in which case the primary parameter can be varied during search within those restrictions.)

In step 912, values are established for those of the parameters that are to remain fixed during the search, and initial values are chosen for those parameters that will be allowed to vary. As in the embodiment of FIG. 7, in one embodiment, the initial values are chosen as values which would be optimum in some circuit design deemed to be "average".

In step 914, an outer loop begins for iterating through the different search parameters that are to be varied. If 10 parameters are to be varied, for example, then this loop has 10 iterations, one per parameter.

In step 915, a candidate test design is generated from the current values for all the test parameters. Again, this includes the current candidate value for current search parameter, optimum values for search parameters previously optimized (in previous iterations of the loop 914), default values for search parameters not yet optimized, and fixed values for parameters not varying. The test design includes the structure of the scan chains, the structure of the compression and decompression circuitry, as well as ATPG configuration parameter values. The candidate test design virtualizes the circuit design and the circuitry of the test design in combination, so that the combination can be evaluated for its ability to detect faults.

In step 916, the combination circuit design and candidate test design circuitry is provided to ATPG, preferably the same ATPG software that will be used as part of step 522 (FIG. 5) to generate final test vectors. The ATPG configuration parameter values for the current candidate test design are provided to ATPG during this step 916, and ATPG proceeds to develop its optimum set of test vectors given those parameter values, and given the structure of the scan circuitry and the compression and decompression circuitry as established in the current candidate test design. Preferably, as shown in FIG. 8, fault sampling is used in step 916, and even more preferably, pattern sampling is used. ATPG produces a test protocol including a set of test vectors and the expected response from each.

In step 918, fault coverage of the test protocol determined by ATPG is evaluated. In another embodiment, another quality measure can be used here, such as test coverage or ATPG effectiveness. Other quality measures will be apparent to the reader.

In step 920, it is determined whether optimum fault coverage has been achieved for the current search parameter. As in FIG. 7, in one embodiment of this step, the test design which is considered to yield optimum fault coverage is the current candidate test design. In another embodiment, the test design which is considered to yield optimum fault coverage can be some other candidate test design, revealed as being optimum by the evaluation of the current candidate test design.

If in step 920 optimum fault coverage has not yet been achieved for the current search parameter, then in step 922, the next candidate value is generated for the current search parameter and the process returns to step 915 to generate a new candidate test design based on it.

If in step 920 optimum fault coverage has been determined to have been achieved for the current search parameter, then in step 923, it is determined whether there are more search parameters to optimize. If so, then the process returns to step 914 to optimize the value of the next search parameter. If not, then in step 924 the process continues with the implementation of the optimum test design. Again, as in FIG. 7, depending on which test parameters had been fixed in step 912, if this involves replacement of the state registers in the circuit design with scan registers organized in accordance with the scan chains implied by the optimal test design parameter values, and/or implementation of specific compression and/or decompression circuitry that are implied by the optimal test design parameter values, then the result is reflected in the netlist brought forward to the next step in the EDA process, such as netlist verification step 518 (FIG. 5). The result is eventually reflected in the masks created in step 530, and the chips 570. Implementation of the optimum test design can also involve bringing forward to the physical implementation step 522, the configuration parameter values determined to be optimal for the final ATPG run. This portion of the test design is not reflected in the mask or chips, but is reflected in the test data sets delivered to chip testing equipment used to test the resulting chips in step 580.

Note that the test by which step 920 makes its determination that optimum fault coverage has been determined to have been achieved for the current search parameter, can be different for different ones of the search parameters. Similarly, the algorithm by which the next candidate value is generated in step 922 can also be different for different ones of the search parameters. Several examples are as follows.

If the current search parameter is the number of modes to implement in the decompressor, the search might traverse candidate values of 2, 3 and 4. The initial value might be 4, and the step 922 of generating the next candidate value might be to decrement the current candidate value by one. Step 920 of determining whether optimum fault coverage has been achieved for the number-of-modes parameter might be simply to stop after the test design generated using a candidate value of 2 has been evaluated. The optimum value for the number-of-modes parameter might then be taken as the value that produced the highest fault coverage metric in step 918. In an embodiment a second level rule might also be implemented: if the highest fault coverage and next-highest fault coverage produced in response to the candidate values are closer than some predetermined difference, then choose the lower of the two values if chip area is of greater concern than pattern count; choose the higher of the two values if pattern count is of greater concern than chip area.

If the current search parameter is the allocation of available I/O pins between device scan inputs and device scan outputs, then the search might traverse candidate values symmetrically bracketing a default value of an equal number of pins allocated to each. The initial value might be to allocate the maximum number of pins to device scan inputs, and step 922 of generating the next candidate value might be to shift the allocation of one pin from the device scan input to device scan output. Step 920 of determining whether optimum fault coverage has been achieved for the pin allocation parameter might be simply to stop after the test design generated using the maximum number of pins allocated to device scan outputs has been evaluated. The optimum value for the pin allocation parameter might then be taken as the value that produced the highest fault coverage metric in step 918.

If the current search parameter is the ATPG abort limit, then the search might traverse a predetermined series of candidate values, for example 10, 100, 400, 700, and so on to some predetermined maximum. The initial value might be 10, and the step 922 of generating the next candidate value might be to substitute the next candidate value in the series. Step 920 of determining whether optimum fault coverage has been achieved for the number-of-modes parameter might be simply to stop after the test design generated using the last candidate value in the series has been evaluated. The optimum value for the number-of-modes parameter might then be taken as the value that produced the highest fault coverage metric in step 918, but only if that fault coverage exceeds by a predetermined increment the next lower fault coverage achieved from another value in step 918. If the fault coverage achieved by the best-producing values for the ATPG abort limit are close to each other, then choose the lower of the two values producing the two best fault coverage.

If the current search parameter is whether to disturb the clock groupings of the circuit design under consideration, then the search might traverse the two values yes and no, starting with one and ending with the other. The step 915 of generating a candidate test design includes a step of executing the design rule checker with the current parameter value provided as a configuration input. If the current candidate value is 'yes', then the design rule checker makes a determination of which clock domains can be clocked together without risk of detrimental interaction, and provides its result as an instruction to ATPG for use in step 916 (and eventually step 522). If the current candidate value is 'no', then the instruction provided to ATPG is to pulse separately each of the clock domains in the circuit design under consideration. The optimum value for the disturb-clock-groupings parameter might then be taken as the value that produced the highest fault coverage metric in step 918.

If the current search parameter is the structure of the decompressor, then the search might traverse candidate values which involve many different arrangements of multiplexers and connections between device scan inputs and multiplexer inputs, that are available within the test architecture made available by the EDA software. The initial iteration of step 922 of generating the next candidate value for the structure of the decompressor might be to adjust certain parameter values resulting in, in step 915, the addition of a multiplexer or a change of a connection. ATPG is run in step 916 and fault coverage of the candidate structure is evaluated in step 918. Depending on the fault coverage determined in step 918, step 922 of generating the next candidate value can decide to accept or reject the most recent adjustment made, and then to make a different adjustment in the parameter values. The arrangement resulting in step 915 is evaluated again in steps 916 and 918, and again step 922 either accepts or rejects the adjustment and makes another adjustment. A simulated annealing search, for example, can be made in this way in order to automatically find the best decompressor structure. A similar search method can be used for automatically finding the best structure for the compressor.

Note that for many of the possible search algorithms in step 714 (FIG. 7), some parameters may need to be optimized before others. For example, if one subset of the parameters to be varied is the assignment of state registers to one or more X-chains (scan chains containing state registers having a high probability of carrying unknown responses), then that subset of parameters should be optimized before optimizing the decompressor architecture. Similarly, the choice of whether to implement output masking may need to be made before optimizing the structure of the output compressor. ATPG only parameters may need to be optimized last.

Figure 10:
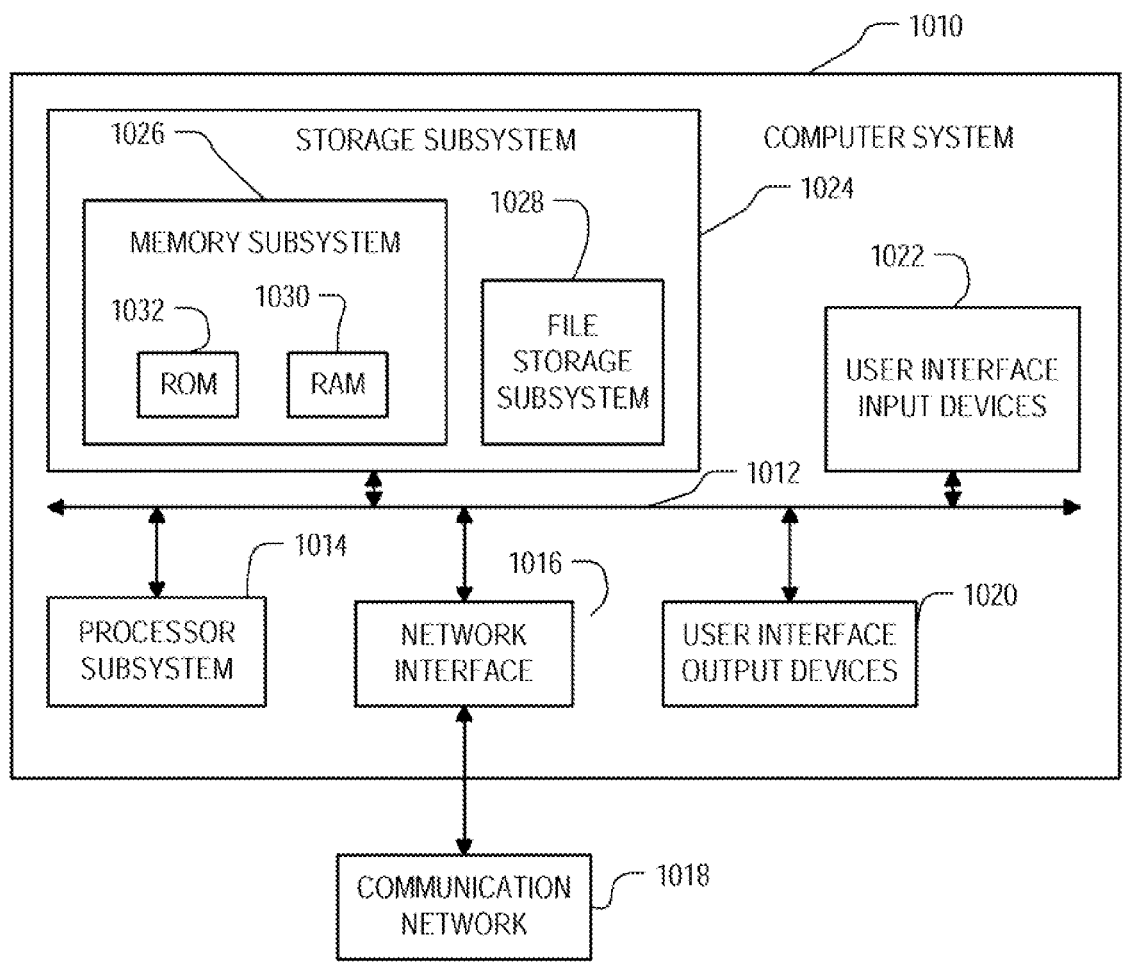
FIG. 10 is a simplified block diagram of a computer system that can be used to implement software incorporating aspects of the present invention.

FIG. 10 is a simplified block diagram of a computer system 1010 that can be used to implement software incorporating aspects of the present invention. While the flow charts and other algorithms set forth herein describe series of steps, it will be appreciated that each step of the flow chart or algorithm can be implemented by causing a computer system such as 1010 to operate in the specified manner.

Computer system 1010 typically includes a processor subsystem 1014 which communicates with a number of peripheral devices via bus subsystem 1012. Processor subsystem 1014 may contain one or a number of processors. The peripheral devices may include a storage subsystem 1024, comprising a memory subsystem 1026 and a file storage subsystem 1028, user interface input devices 1022, user interface output devices 1020, and a network interface subsystem 1016. The input and output devices allow user interaction with computer system 1010. Network interface subsystem 1016 provides an interface to outside networks, including an interface to communication network 1018, and is coupled via communication network 1018 to corresponding interface devices in other computer systems. Communication network 1018 may comprise many interconnected computer systems and communication links. These communication links may be wireline links, optical links, wireless links, or any other mechanisms for communication of information. While in one embodiment, communication network 1018 is the Internet, in other embodiments, communication network 1018 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1022 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1010 or onto computer network 1018.

User interface output devices 1020 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 1010 to the user or to another machine or computer system.

Storage subsystem 1024 stores the basic programming and data constructs that provide the functionality of certain embodiments of the present invention. For example, the various modules implementing the functionality of certain embodiments of the invention may be stored in storage subsystem 1024. These software modules are generally executed by processor subsystem 1014.

Memory subsystem 1026 typically includes a number of memories including a main random access memory (RAM) 1030 for storage of instructions and data during program execution and a read only memory (ROM) 1032 in which fixed instructions are stored. File storage subsystem 1028 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 1028. The host memory 1026 contains, among other things, computer instructions which, when executed by the processor subsystem 1014, cause the computer system to operate or perform functions as described herein. As used herein, processes and software that are said to run in or on "the host" or "the computer", execute on the processor subsystem 1014 in response to computer instructions and data in the host memory subsystem 1026 including any other local or remote storage for such instructions and data.

Bus subsystem 1012 provides a mechanism for letting the various components and subsystems of computer system 1010 communicate with each other as intended. Although bus subsystem 1012 is shown schematically as a single bus, alternative embodiments of the bus subsystem may use multiple busses.

Computer system 1010 itself can be of varying types including a personal computer, a portable computer, a workstation, a computer terminal, a network computer, a television, a mainframe, a parallel processing system, a network of more than one computer, or any other data processing system or user device. Due to the ever-changing nature of computers and networks, the description of computer system 1010 depicted in FIG. 10 is intended only as a specific example for purposes of illustrating the preferred embodiments of the present invention. Many other configurations of computer system 1010 are possible having more or less components than the computer system depicted in FIG. 10.

As used herein, a given activity is "responsive" to a predecessor input if the predecessor input influenced the given activity. If there is an intervening processing element, step or time period, the given activity can still be "responsive" to the predecessor input. If the intervening processing element or step combines more than one input, the activity is considered "responsive" to each of the inputs. "Dependency" of a given activity upon one or more inputs is defined similarly.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, whereas the embodiments of FIGS. 7 and 9 perform an iterative search to find the best test design, another embodiment could attain the same or similar results without iteration, such as by evaluating candidate test designs in parallel, optionally using different processors. As another example, whereas in the embodiments if FIGS. 7 and 9 select the best test design on the basis of optimum fault coverage (or some other quality metric), it will be appreciated that in another embodiment the best test design might be selected on the basis of some other metric, such as power dissipation during test, with optimum quality optionally being only a secondary selection criterion. Alternatively, the quality metric could be used as only one factor in a weighted average with one or more other factors. In general, the metric used to determine the "best" test design is sometimes referred to herein as a "figure of merit" for the test design, the quality metric being only a preferred example of such a figure of merit. As yet another example, ATPG in a step such as step 810 in FIG. 8 can identify all potential faults in not merely the circuit design alone, but in the combination circuit design and test design. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

We claim as follows:

1. A method for developing a scan-based test design for an integrated circuit design, comprising the steps of:

developing a plurality of candidate test designs for the circuit design, including using a computer system, generating a plurality of test vectors in dependence upon the circuit design;

using a computer system, generating a test protocol figure of merit for each of the candidate test designs; and selecting, in dependence upon a comparison among the test protocol figures of merit generated for each of the candidate test designs, one of the candidate test designs for implementation in an integrated circuit device, wherein the step of generating a plurality of test vectors employs a predetermined automatic test pattern generation algorithm, and wherein the step of generating a test protocol figure of merit for each of the candidate test designs comprises the step of determining the test protocol figure of merit for each particular candidate test design using at least one but not all of the test vectors that would be generated if the predetermined automatic test pattern generation algorithm were run to completion.

2. A method according to claim 1, wherein the plurality of candidate test designs include differing arrangements of state registers of the circuit design into scan chains.

3. A method according to claim 1, wherein the plurality of candidate test designs include differing decompression circuitry interconnecting device scan input pins to scan chain inputs.

4. A method according to claim 1, wherein the plurality of candidate test designs include differing compression circuitry interconnecting scan chain outputs to device scan output pins.

5. A method according to claim 1, wherein the plurality of candidate test designs include differing configuration parameter values for controlling the operation of the automatic test pattern generation algorithm.

6. A method according to claim 1, further comprising the step of incorporating into a combined design both the circuit design and at least a scan chain arrangement and a decompressor arrangement from the candidate test design selected in the step of selecting; and running the predetermined automatic test pattern generation algorithm to completion in dependence upon the combined design.

7. A method according to claim 1, further comprising the step of running the predetermined automatic test pattern generation algorithm to completion in dependence upon the candidate test design selected in the step of selecting.

8. A method according to claim 7, wherein the step of running the predetermined automatic test pattern generation algorithm to completion yields a plurality of test vectors, further comprising the step of providing the plurality of test vectors to integrated circuit testing equipment for use in testing integrated circuit chips fabricated in dependence upon the circuit design and the candidate test design selected in the step of selecting.

9. A method according to claim 7, wherein the plurality of candidate test designs include differing configuration parameter values for controlling the operation of the automatic test pattern generation algorithm, and wherein the step of running the predetermined automatic test pattern generation algorithm to completion comprises the step of applying the configuration parameter values in the candidate test design selected in the step of selecting.

10. A method according to claim 1, further comprising the step of generating a set of fabrication masks in dependence upon the circuit design and the candidate test design selected in the step of selecting.

11. A method according to claim 1, wherein the step of determining the test protocol figure of merit for each particular candidate test design using at least one but not all of the test vectors that would be generated if the predetermined automatic test pattern generation algorithm were run to completion, uses at most 256 test vectors.

12. A method according to claim 11, wherein the step of determining the test protocol figure of merit for each particular candidate test design using at least one but not all of the test vectors that would be generated if the predetermined automatic test pattern generation algorithm were run to completion, uses more than 32 test vectors.

13. A method according to claim 1, wherein the step of determining the test protocol figure of merit for each particular candidate test design using at least one but not all of the test vectors that would be generated if the predetermined automatic test pattern generation algorithm were run to completion, uses at most 64 test vectors.

14. A method according to claim 1, wherein the predetermined automatic test pattern generation algorithm generates test patterns in a sequence, and wherein the step of determining the test protocol figure of merit for each particular candidate test design using at least one but not all of the test vectors that would be generated if the predetermined automatic test pattern generation algorithm were run to completion, uses only the first N test vectors generated by the predetermined automatic test pattern generation algorithm, where N is a predetermined integer which is fixed for all of the candidate test designs in the plurality of candidate test designs.

15. A method according to claim 14, wherein the step of generating a plurality of test vectors comprises the step of operating the predetermined automatic test pattern generation algorithm until N test vectors have been generated; and stopping the predetermined automatic test pattern generation algorithm before any further test vectors have been generated.

16. A method according to claim 1, wherein the test protocol figure of merit is a test protocol quality measure.

17. A method according to claim 1, wherein the test protocol figure of merit is fault coverage.

18. A method according to claim 1, wherein the step of selecting one of the candidate test designs comprises the step of iteratively searching among the candidate test designs for one which maximizes the test protocol figure of merit.

19. A method according to claim 1, wherein the step of generating a plurality of test vectors in dependence upon the circuit design comprises the steps of:

identifying a set of potential faults that might occur in an integrated circuit device fabricated according to the circuit design; and operating the predetermined automatic test pattern generation algorithm so as to target only a sampling of potential faults in the set of potential faults.

20. An integrated circuit device produced using the method of claim 1.

21. The set of fabrication masks generated using the method of claim 10.

22. A system for developing a scan-based test design for an integrated circuit design, comprising:

a data processor;

a storage subsystem; and program code which when executed by the data processor performs the steps of:

developing a plurality of candidate test designs for the circuit design, including generating a plurality of test vectors in dependence upon the circuit design;

generating a test protocol figure of merit for each of the candidate test designs; and selecting, in dependence upon a comparison among the test protocol figures of merit generated for each of the candidate test designs, one of the candidate test designs for implementation in an integrated circuit device, wherein the step of generating a plurality of test vectors employs a predetermined automatic test pattern generation algorithm, and wherein the step of generating a test protocol figure of merit for each of the candidate test designs comprises the step of determining the test protocol figure of merit for each particular candidate test design using at least one but not all of the test vectors that would be generated if the predetermined automatic test pattern generation algorithm were run to completion.

23. A system according to claim 22, wherein the plurality of candidate test designs include differing arrangements of state registers of the circuit design into scan chains.

24. A system according to claim 22, wherein the plurality of candidate test designs include differing decompression circuitry interconnecting device scan input pins to scan chain inputs.

25. A system according to claim 22, wherein the plurality of candidate test designs include differing compression circuitry interconnecting scan chain outputs to device scan output pins.

26. A system according to claim 22, wherein the plurality of candidate test designs include differing configuration parameter values for controlling the operation of the automatic test pattern generation algorithm.

27. A system according to claim 22, wherein the program code further:

incorporates into a combined design both the circuit design and at least a scan chain arrangement and a decompressor arrangement from the candidate test design selected in the step of selecting; and runs the predetermined automatic test pattern generation algorithm to completion in dependence upon the combined design.

28. A system according to claim 22, wherein the program code further runs the predetermined automatic test pattern generation algorithm to completion in dependence upon the candidate test design selected in the step of selecting.

29. A system according to claim 28, wherein the running the predetermined automatic test pattern generation algorithm to completion yields a plurality of test vectors, and wherein the program code further outputs the plurality of test vectors for use by integrated circuit testing equipment in testing integrated circuit chips fabricated in dependence upon the circuit design and the candidate test design selected in the step of selecting.

30. A system according to claim 28, wherein the plurality of candidate test designs include differing configuration parameter values for controlling the operation of the automatic test pattern generation algorithm, and wherein the step of running the predetermined automatic test pattern generation algorithm to completion comprises the step of applying the configuration parameter values in the candidate test design selected in the step of selecting.

31. A system according to claim 22, wherein the program code further provides the candidate test design selected in the step of selecting, for use by mask-making equipment for fabricating masks.

32. A system according to claim 22, wherein the step of determining the test protocol figure of merit for each particular candidate test design using at least one but not all of the test vectors that would be generated if the predetermined automatic test pattern generation algorithm were run to completion, uses at most 256 test vectors.

33. A system according to claim 32, wherein the step of determining the test protocol figure of merit for each particular candidate test design using at least one but not all of the test vectors that would be generated if the predetermined automatic test pattern generation algorithm were run to completion, uses more than 32 test vectors.

34. A system according to claim 22, wherein the step of determining the test protocol figure of merit for each particular candidate test design using at least one but not all of the test vectors that would be generated if the predetermined automatic test pattern generation algorithm were run to completion, uses at most 64 test vectors.

35. A system according to claim 22, wherein the predetermined automatic test pattern generation algorithm generates test patterns in a sequence, and wherein the step of determining the test protocol figure of merit for each particular candidate test design using at least one but not all of the test vectors that would be generated if the predetermined automatic test pattern generation algorithm were run to completion, uses only the first N test vectors generated by the predetermined automatic test pattern generation algorithm, where N is a predetermined integer which is fixed for all of the candidate test designs in the plurality of candidate test designs.

36. A system according to claim 35, wherein as part of the step of generating a plurality of test vectors, the program code operates the predetermined automatic test pattern generation algorithm until N test vectors have been generated, and stops the predetermined automatic test pattern generation algorithm before any further test vectors have been generated.

37. A system according to claim 22, wherein the test protocol figure of merit is a test protocol quality measure.

38. A system according to claim 22, wherein the test protocol figure of merit is fault coverage.

39. A system according to claim 22, wherein as part of the step of selecting one of the candidate test designs, the program code iteratively searches among the candidate test designs for one which maximizes the test protocol figure of merit.

40. A system according to claim 22, wherein as part of the step of generating a plurality of test vectors in dependence upon the circuit design, the program code:

identifies a set of potential faults that might occur in an integrated circuit device fabricated according to the circuit design; and operates the predetermined automatic test pattern generation algorithm so as to target only a sampling of potential faults in the set of potential faults.

41. A non-transitive computer readable storage medium having stored thereon a plurality of software code portions which when executed by a processor perform the steps of:

developing a plurality of candidate test designs for the circuit design, including generating a plurality of test vectors in dependence upon the circuit design;

generating a test protocol figure of merit for each of the candidate test designs; and selecting, in dependence upon a comparison among the test protocol figures of merit generated for each of the candidate test designs, one of the candidate test designs for implementation in an integrated circuit device, wherein the step of generating a plurality of test vectors employs a predetermined automatic test pattern generation algorithm, and wherein the step of generating a test protocol figure of merit for each of the candidate test designs comprises the step of determining the test protocol figure of merit for each particular candidate test design using at least one but not all of the test vectors that would be generated if the predetermined automatic test pattern generation algorithm were run to completion.

* * * * *